WITNESSES:
Bernard R. Giegucz
Leon J. Taza

INVENTORS
John F. Reuther and
Jerome Sandin.
BY
Francis V. B. Giolma
ATTORNEY

United States Patent Office 3,058,036

Patented Oct. 9, 1962

3,058,036
SEMICONDUCTOR CIRCUIT INTERRUPTER

John F. Reuther, Penn Township, Allegheny County, and Jerome Sandin, Forest Hills, Pa., assignors to Westinghouse Electric Corporation, East Pittsburgh, Pa., a corporation of Pennsylvania Filed July 9, 1957, Ser. No. 670,684
7 Claims. (Cl. 317—31)

Our invention relates generally to circuit interrupters, and it has reference in particular to semiconductor circuit interrupters.

Generally stated, it is an object of our invention to provide for using transistors as circuit interrupters.

More specifically, it is an object of our invention to provide for using a semiconductor to normally connect a load circuit to a source and for controlling the semiconductor to block the flow of current to the load circuit in the event that such current exceeds a predetermined value.

Another object of our invention is to provide for normally supplying base current to a transistor connecting a load circuit to a source and for using another transistor to shunt the base and emitter of the first-mentioned transistor to effect a switching operation thereof and effect disconnection of the load circuit from the source.

Yet another object of our invention is to provide for using semiconductor means to connect a load circuit to a source and for using the increased voltage drop across the semiconductor means during an overcurrent to operate the semiconductor means as a switch by using other semiconductor means to short the base circuit of the semiconductor means in the load circuit.

It is also an important object of our invention to provide for using a transistor as a switch to connect a load circuit to a source and for using a static inverter to control the base current of the transistor.

Another important object of our invention is to provide for using a plurality of transistors in cascade to connect a load circuit to a relatively high voltage source, and for using the voltage drop across the transistors upon the occurrence of an overload to operate a control transistor for reducing the base current of the plurality of transistors to disconnect the load circuit from the source.

Yet another object of our invention is to provide in a semiconductor switching circuit for utilizing only the voltage of the source to which a load is connected, for controlling the connection of the load thereto.

Other objects will in part be obvious, and will in part be explained hereinafter.

In practicing our invention in accordance with one of its embodiments, a plurality of transistors are connected in series with a load circuit and a direct-current source for switching the connection of the load circuit and source. Base current is supplied to each transistor through rectifiers from secondary windings of a transformer energized through a static inverter. A control transistor which obtains its base current from the source through a suitable dropping resistor is used to effect energization of the inverter. An additional control transistor is connected to short the base-emitter circuit of the control transistor and derives its base current from across the plurality of transistors, so that an increase in current therethrough which results in an increased voltage drop, causes the inverter to be disconnected from the source, cutting off the base current to the plurality of transistors, and causing them to interrupt the flow of current to the load circuit.

For a more complete understanding of the nature and scope of our invention, reference may be made to the following detailed description, which may be read in connection with the accompanying drawings, in which.

Figure 1:
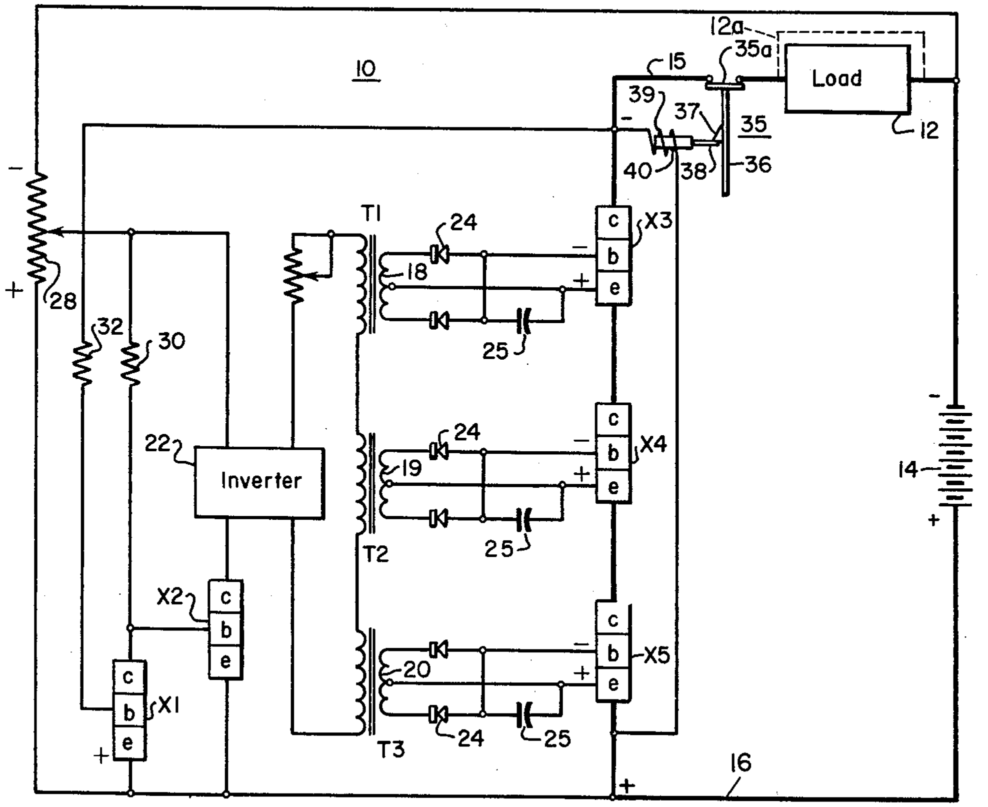
FIGURE 1 is a schematic diagram of a semiconductor switching circuit embodying the invention in one of its forms.

Referring to FIG. 1, the reference numeral 10 may denote generally a semiconductor switching circuit for connecting a load 12 to a source, such as a battery 14. The switching circuit 10 may comprise a plurality of transistors X3, X4 and X5, for example, connected in series circuit relation with the load 12 and the battery 14 by means of a load circuit including conductors 15 and 16. The transistors may be of any suitable type, being for example of the fused alloy junction type, each having a base electrode *b* interposed between collector and emitter electrodes *c* and *e*, respectively. The transistors may be rendered conductive by means of base current supplied from the secondary windings 18, 19 and 20 of transformers T1, T2, T3, which may be energized from an inverter 22, which may be of the type which is described in detail in Paper 55–73 by G. H. Royer, entitled "Switching Transistor D.-C. to A.-C. Converter," pages 322 to 325 of the A.I.E.E. Transactions, volume 74, part 1. Rectifier devices 24 are connected in circuit with the secondary windings and the base and emitter electrodes. Capacitors 25 are utilized to filter the voltage applied to the transistors since the output of the inverter is not a pure square wave.

The inverter 22 is energized by connecting it across the source 14 through a potentiometer 28 which may be adjusted to apply a suitable voltage to the inverter. The inverter 22 is connected in series with a transistor X2 having its base electrode *b* connected to the potentiometer 28 through a suitable dropping resistor 30, so as to provide sufficient base current for the transistor X2 to cause it to saturate. Control of the transistor X2 is provided by a control transistor X1 connected between the base electrode *b* of transistor X2 and its emitter *e* for shorting the base-emitter circuit. The control transistor X1 is controlled by connecting its base-emitter circuit across the plurality of transistors X3, X4 and X5 through a suitable current limiting resistor 32. This resistor 32 may be selected so that the normal voltage drop across the plurality of transistors X3, X4 and X5 when conducting normal load current is not sufficient to drive the control transistor X1 to saturate, but the increased voltage caused by a predetermined overcurrent is.

A circuit interrupter 35 may be provided having a contact member 35a connected in series with the load circuit conductor 15 and the load 12 for disconnecting the load from the load circuit. The interrupter 35 may be of any suitable type and is herein shown as comprising a movable contact rod 36 having a detent 37 engaged by a latch member 38 for holding the interrupter closed. A solenoid 39 having an armature 40 operable to withdraw the latch member 38 is provided for operating the interrupter. The solenoid 39 may be connected across the plurality of transistors X3, X4 and X5 so as to open the interrupter 35 when the plurality of transistors are driven to cutoff and the voltage drop thereacross rises to substantially the voltage of the source 14.

In operation, the switch or interrupter 35 will normally be closed, and the transistor X2 will be supplied with sufficient base current from the source 14 through the resistor 30 to drive it to saturation. The control transistor X1 will normally be cut off and the inverter 22 normally effects energization of the control transformers T1, T2 and T3 so as to provide rectified base current to the base electrodes *b* of the transistors X3, X4 and X5 through rectifier devices 24. The transistors X3, X4 and X5 are thus driven to saturation and effectively connect the load 12 to the battery 14, the voltage drop across the transistors being at a minimum.

Should a fault occur in the load circuit, as indicated by the dotted line **12*a*, which tends to increase the current through the transistors X3, X4 and X5, the voltage drop thereacross rises sharply. The voltage applied to the base circuit of the control transistor X1 correspondingly rises sharply causing an increased base current to flow, thus driving the control transistor X1 to saturation. This short circuits the base-emitter circuit of the transistor X2, reducing the base current thereof and causing the transistor X2 to go to cutoff. The inverter 22 is thereupon effectively disconnected from a source 14, and no base current is supplied to the transistors X3, X4 and X5, causing them to go to cutoff. The load 12 is thereupon effectively disconnected from the source 14 and the full voltage of the source 14 appears across the transistors X3, X4 and X5, causing energization of the solenoid 39, which opens the interrupter 35**.

Figure 2:
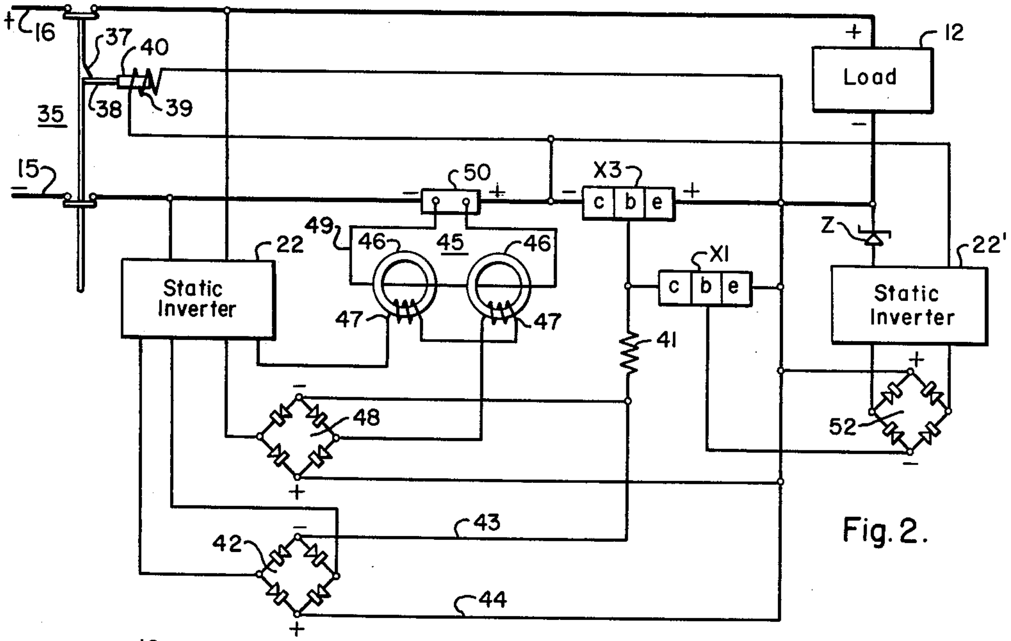
FIG. 2 is a schematic diagram of a switching circuit embodying the invention in another of its forms.

Referring to FIG. 2, it will be seen that a transistor X3 is used to control the connection of a load 12 to a source through conductors 15 and 16. A circuit interrupter 35 is used to isolate the load 12 from the source conductors, and is provided with a solenoid 39 for operating an armature 40 to withdraw a latch member 38 from engagement with a detent 37 to open the interrupter.

The transistor X3 is normally supplied with base current from a static inverter 22 energized from the conductors 15 and 16, through a rectifier bridge circuit 42 connected by means of conductors 43 and 44, and a current limiting resistor 41 between the base electrode *b* and the emitter *e* of the transistor X3 so as to render the transistor conductive for normal values of load current.

In order to provide for increasing the current carrying capacity of the transistor X3, for a normal range of overloads, control means 45 may be provided for increasing the base current of the transistor for overloals up to a predetermined value. The control means 45 may comprise a pair of saturable reactor cores 46 having alternating-current control windings 47 thereon connected in series with an output circuit of the inverter 22 and a rectifier bridge circuit 48 which is connected in parallel with the bridge circuit 42 through the resistor 41. The saturable cores 46 may be controlled up to a predetermined value of overload by means of a direct-current circuit 49 energized from a shunt 50 connected in series with the load 12 and the source.

Cutoff of the transistor X3 may be effected by means of a control transistor X1 which is connected between the base and emitter electrodes *b* and *e* of transistor X3 for shorting them. The transistor X1 is normally at cutoff, and is provided with base current from a rectifier bridge circuit 52 by means of a static inverter 22′ which is connected across the transistor X3 in series with a Zener diode Z having a breakdown value equal to the voltage across the transistor X3 at a value of current equal to or slightly in excess of the maximum value for which the control means 45 is designed to operate. The inverter 22′ is provided with suitable time delay by means of an internal RC circuit, or the like, to permit the transistor X3 to saturate when power is first applied, so as to prevent immediate tripping.

In operation, the switch 35 will be closed, and the transistor X3 will be saturated for normal load currents by means of base current supplied by means of the static inverter 22 through the rectifier bridge circuit 42. Additional base current is supplied to the transistor X3 from the bridge circuit 48 by means of the control circuit 45 for increasing values of load current, thus enabling the transistor X3 to accommodate a reasonable value of overcurrent without going to cutoff.

Should the load current exceed such reasonable value of overcurrent, no additional base current is provided by the control means 45, since the cores 46 saturate when such value is attained, and no further increased current through the shunt 50 will provide any greater base current. Thereupon, the voltage drop across the transistor X3 rises sharply. This causes breakdown of the Zener diode Z, effecting energization of the inverter 22′ so that base current is supplied to the control transistor X1 from the rectifier bridge circuit 52. The control transistor X1 thereupon saturates and short circuits the base-emitter circuit of the transistor X3, causing the transistor X3 to go to cutoff and block the flow of current to the load 12. The full voltage of the source thereupon appears across the transistor X3, causing energization of the solenoid 39 sufficiently to operate the latch member 38 to disengage the detent 37, whereupon the interrupter 35 opens.

Figure 3:
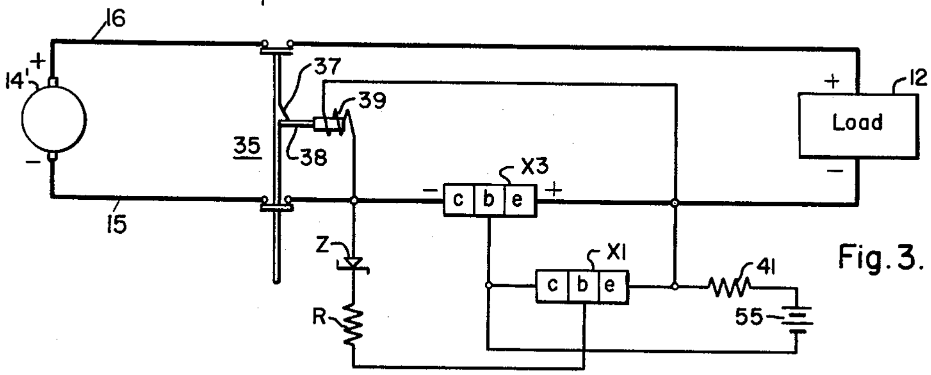
FIG. 3 is a schematic diagram of yet another switching circuit embodying the invention.

Referring to FIG. 3, it will be seen that a transistor X3 is utilized to connect a load 12 to a source 14′. The transistor X3 is normally provided with base current from a source such as a battery 55 through a current limiting resistor 41, so as to effect saturation thereof. A circuit interrupter 35 is utilized to disconnect the load 12 from the source 14′ after the transistor X3 has interrupted the circuit, being of a type similar to that shown in the preceding figures, wherein a solenoid 39 is connected across the transistor X3 for operating a latch member 38 to disengage a detent 37 for opening the interrupter.

Switching of the transistor X3 is obtained by means of a control transistor X1 connected to shunt the base-emitter circuit of the transistor X3. The base-emitter circuit *b-e* of the control transistor X1 is connected across the transistor X3 through a Zener diode Z, which has a breakdown value equal to the voltage which appears across the transistor X3 at the value of current which it is desired to interrupt. A resistor R is connected in series with the Zener diode Z to limit the base current upon breakdown of the diode.

In a normal operation, the base electrode *b* of the transistor X3 is maintained negative with respect to the emitter *e* by means of the battery 55, so that the transistor X3 is saturated and effectively connects the load 12 to the source 14′. Should excessive current tend to flow through the load 12, the voltage drop across the transistor X3 rises sharply. This causes breakdown of the Zener diode Z, so that sufficient base current flows in the emitter-base circuit *e-b* of control transistor X1 to drive it to saturation. This shorts the base-emitter circuit of the transistor X3, and drives it to cutoff, so as to block the flow of current to the load 12. The voltage across the transistor X3 thereupon rises to substantially the voltage of the source 14′, and effects operation of the solenoid 39 to withdraw the latch member 38 from the detent 37 and cause operation of the interrupter 35 to isolate the load from the source.

Figure 4:
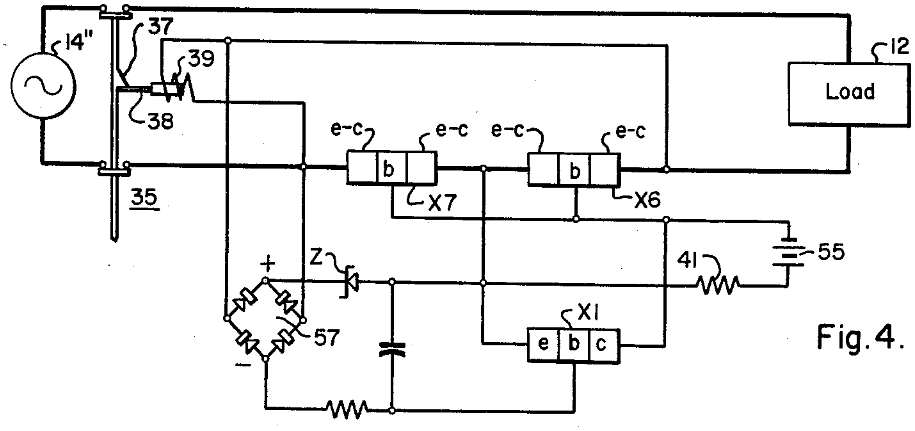
FIG. 4 is a schematic diagram of the invention applied to an alternating-current circuit.

Referring to FIG. 4, the reference numeral 12 designates a load which is connected to an alternating-current source 14″ by means of transistors X6, X7 which are connected in series circuit relation. The transistors X6, X7 may be similar to the transistors utilized in the circuits hereinbefore described, but are preferably of a symmetrical type, having emitter-collector electrodes *e-c* on each side of the base electrode *b* which are substantially identical, so that these transistors may be utilized to conduct opposite halves of an alternating current. Base current may be supplied to the base electrodes *b* and the common emitter-collector electrodes *e-c* from a source such as a battery 55 through a resistor 41 for normally maintaining the transistors X6 and X7 conductive to alternating current. An interrupter 35 similar to those hereinbefore described may be connected in series with the load 12, the transistors X6 and X7, and the source 14'', having a solenoid 39 for retracting a latch member 38 from engagement with a detent 37 for opening of the interrupter to isolate the load and the source.

Switching of the transistors X6 and X7 may be effected by means of a control transistor X1, which is connected between the base electrodes *b* and the common emitter-collector electrodes *e-c* of the transistors X6 and X7 for shunting this circuit. Control of the control transistor X1 is provided by connecting the emitter-base circuit across the output circuit of a rectifier bridge circuit 57, which is connected across the transistors X6 and X7. In order to render the control transistor X1 saturated only when the load current exceeds a certain value, a Zener diode Z may be connected in series with the bridge circuit 57 and the base-emitter circuit of the transistor X1, so as to break down only when the voltage across the transistors X6 and X7 exceeds a predetermined value, in accordance with the current value at which the circuit is to be interrupted.

Under normal operating conditions, the transistors X6 and X7 are supplied with base current from the battery 55 and are driven to saturation, so that they effectively connect the load 12 to the alternating-current source 14''. When the load current exceeds a predetermined value for which the base current is provided, the voltage drop across the transistor X6 and X7 rises sharply, and the voltage from the circuit 57 rises to a value sufficient to cause breakdown of the Zener diode Z. This provides base current for the control transistor X1, which saturates and effectively short circuits the base and common emitter-collector electrodes of the transistors X6 and X7, causing these transistors to cutoff and block the flow of current to the load 12. Substantially the full voltage of the source then appears across the transistors X6 and X7, so as to effect energization of the solenoid 39 to open the interrupter 35 and isolate the load from the source.

From the above description and the accompanying drawings, it will be apparent that we have provided in a simple and effective manner for controlling the conductivity of semiconductor switch devices to provide for connecting and disconnecting a load to and from a source. By utilizing a control transistor to shunt the base-emitter circuit of the switching transistor, reliable and effective control of the switching transistor is positively obtained. Switch devices embodying the features of our invention may be readily utilized for disconnecting a load from the source. Either manual disconnect means may be used therewith to completely isolate the load and the source, or automatic operation of a disconnect device or circuit interrupter may be effected as described in response to the increase in voltage across the semiconductor switch.

Certain features of the invention are set forth and claimed in consurrently filed United States patent application Serial No. 670,683, by Jerome Sandin, and assigned to the assignee of the instant application.

Since certain changes may be made in the above-described construction and different embodiments of the invention may be made without departing from the spirit and scope thereof, it is intended that all the matter contained in the above description and shown in the accompanying drawings, shall be considered as illustrative and not in a limiting sense.

We claim as our invention:

1. In combination, a circuit interrupter having trip means for effecting opening of the circuit interrupter upon the occurrence of overload currents in excess of a predetermined value, a first series transistor means having a base-emitter circuit and a collector, a source of electrical power, a load, a first circuit means connecting said first transistor means in series circuit with the power source, circuit interrupter and load; second circuit means connecting said trip means in shunting relationship with the first transistor means, third circuit means including a second transistor means adapted to supply base current of a predetermined value to the base-emitter circuit of the first transistor means to effect saturation of said first transistor means during the normal operation thereof in carrying normal load currents below said predetermined value, said second transistor means having a base-emitter circuit for controlling the operation thereof, a third transistor means having a base-emitter circuit connected in shunting relationship with the base-emitter circuit of said second transistor means, and fourth circuit means for connecting the base-emitter circuit of said third transistor means across said first transistor means to be impressed by the voltage rise thereacross, whereby overload currents in excess of said predetermined value will effect a rise of voltage in the collector-emitter circuit of said first transistor means upon the operating point thereof leaving the saturation region thereof, and whereby said rise of voltage across said first transistor means will effect saturation of said third transistor means and so render said second transistor means non-conductive.

2. In combination, a circuit interrupter having voltage-responsive trip means operable to open the circuit interrupter upon the occurrence of overload currents in excess of a predetermined value, a series transistor means having a base-emitter circuit, a source of electrical power, a load, a first circuit means connecting said series transistor means in series circuit with the power source, circuit interrupter and load; second circuit means connecting said voltage-responsive trip means in shunting relationship with the series transistor means, third circuit means for providing a base current of sufficient amperage in the base-emitter circuit of said series transistor means to effect saturation of the series transistor means during the normal operation thereof in carrying normal load currents below said predetermined value, and fourth circuit means connected in shunting relationship with said series transistor means and responsive to the voltage rise thereacross upon the operating point thereof leaving the saturation region of the series transistor means to effect thereby shunting of the base-emitter circuit of the series transistor means, whereby the progressive self-choking action exerted upon the base current of the series transistor means accelerates the voltage rise across the series transistor means to result in quickly energizing said voltage-responsive trip means to open the circuit interrupter.

3. In combination, a circuit interrupter, a series first transistor means having a base-emitter circuit, a source of electrical power, a load, a first circuit means connecting said series first transistor means in series circuit with the power source, circuit interrupter and load; second circuit means for providing a base current of sufficient amperage in the base-emitter circuit of said series first transistor means to effect saturation of the series first transistor means during the normal operation thereof in carrying normal load currents below a predetermined value, a second transistor having a base-emitter circuit disposed in shunting relationship with the base-emitter circuit of said series first transistor means, and third circuit means for connecting the base-emitter circuit of said second transistor means so as to be responsive to the voltage rise across said series first transistor means, whereby upon the load current exceeding said predetermined value the operating point of said series first transistor means leaves the saturation region to result in voltage rise across said first transistor means, and whereby the last-mentioned voltage rise effects base current flow in the base-emitter circuit of said second transistor means to electrically shunt the base-emitter circuit of said series first transistor means.

4. The combination as set forth in claim 3, wherein voltage-responsive trip means are provided for the circuit interrupter and connected across said series transistor means to be responsive to the voltage rise thereacross, and said third circuit means includes a Zener diode.

5. In combination, a circuit interrupter having voltage-responsive trip means for effecting the opening of the circuit interrupter upon the occurrence of overload currents in excess of a predetermined value, a load, a source of direct-current electrical power, a plurality of serially-related series first transistor devices each having a base-emitter circuit, first circuit means connecting said plurality of serially related series first transistor devices in series circuit with the load, direct-current power source and circuit interrupter; second circuit means connecting said voltage-responsive trip means in shunting relationship with said plurality of first transistor devices; third circuit means including an inverter energized from said direct-current power source and a plurality of transformers, one for each first transistor device, for providing sufficient base current for the base-emitter circuit of each first transistor device for the saturation thereof in transmitting load current below said predetermined value, a second transistor device having a base-emitter circuit for controlling the current flow in said third circuit means and consequently controlling the base current in each of said plurality of first transistor devices, and fourth circuit means for connecting the base-emitter circuit of said second transistor device in shunting relationship across said plurality of first transistor devices so as to be responsive to the voltage rise thereacross, whereby overload current in excess of said predetermined value causes the operating point of each first transistor device to move out of the saturation region of said transistor device and effect voltage rise across said serially-related first transistor devices, and whereby said rise of voltage effects conduction of said second transistor device to correspondingly effect reduction of the base current of said first transistor devices, and whereby the rise of voltage across said serially-related first transistor devices is sufficient to energize said voltage-responsive trip means and trip the circuit interrupter open.

6. In combination, a circuit interrupter having voltage-responsive trip means for effecting opening of the circuit interrupter upon the occurrence of overload currents in excess of a predetermined value, a series first transistor means having a base-emitter circuit, a source of electrical power, a load, a first circuit means connecting said first transistor means in series circuit with the power source, circuit interrupter and load; second circuit means connecting said trip means in shunting relationship with the first transistor means, third circuit means adapted to supply base current of a predetermined value to the base-emitter circuit of the first transistor means to effect saturation of said first transistor means during the normal operation thereof in carrying normal load currents below said predetermined value, a second transistor means having a base-emitter circuit for controlling the current flow in said third circuit means and consequently controlling the base current flow in said first transistor means, and fourth circuit means for connecting the base-emitter circuit of said second transistor means in shunting relationship across said first transistor means so as to be responsive to the voltage rise thereacross, whereby overload current in excess of said predetermined value causes the operating point of the first transistor means to move out of the saturation region of said first transistor means and effect voltage rise across said first transistor means, and whereby said rise of voltage effects conduction of said second transistor means to correspondingly effect reduction of the base current of said first transistor means, and whereby the rise of voltage across the first transistor means is sufficient to energize said voltage-responsive trip means and thereby trip the circuit interrupter open.

7. In combination, a circuit interrupter adapted to carry normal load currents, high overload currents, and an intermediate range of overload currents which is intermediate, in amperage value, the normal load current and the high overload currents; voltage-responsive trip means operable to open the circuit interrupter upon the occurrence of high overload currents in excess of a predetermined value which is higher than said intermediate range of overload currents; a series transistor means having a base-emitter circuit, a source of electrical power, a load, a first circuit means connecting said series transistor means in series circuit with the power source, circuit interrupter and load; second circuit means connecting said voltage-responsive trip means in shunting relationship across the series transistor means, third circuit means for providing a base current of sufficient amperage in the base-emitter circuit of said series transistor means to effect saturation of the series transistor means during the normal operation thereof in carrying normal load currents lower than said intermediate range, fourth circuit means responsive to the magnitude of the current flowing in said first circuit means to augment the flow of base current in the base-emitter circuit of the series transistor means to enable the same to remain substantially saturated in handling the intermediate current range, and fifth circuit means responsive to the voltage rise above a predetermined value across said series transistor means to shunt the base-emitter circuit of said series transistor means to thereby correspondingly cutoff said series transistor means and so interrupt the high overload current, whereby the resultant voltage rise across the cutoff series transistor means energizes said voltage-responsive trip means to effect opening of the circuit interrupter.

References Cited in the file of this patent

UNITED STATES PATENTS

| | | |
|---|---|---|
| 1,947,193 | Evans | Feb. 13, 1934 |
| 2,082,123 | Samuel | June 1, 1937 |
| 2,671,874 | Friedrichs | Mar. 9, 1954 |
| 2,722,649 | Immel | Nov. 1, 1955 |
| 2,751,549 | Chase | June 19, 1956 |
| 2,776,382 | Fensen | Jan. 1, 1957 |
| 2,823,338 | Edsall | Feb. 11, 1958 |
| 2,832,035 | Bruck | Apr. 22, 1958 |
| 2,832,900 | Ford | Apr. 29, 1958 |
| 2,841,757 | Shields | July 1, 1958 |
| 2,845,583 | Reuther | July 29, 1958 |
| 2,850,694 | Hamilton | Sept. 2, 1958 |
| 2,885,570 | Bright | May 5, 1959 |
| 2,907,932 | Patchell | Oct. 6, 1959 |
| 2,921,264 | Sundt | Jan. 12, 1960 |

OTHER REFERENCES

AIEE Transactions, March 1955; pp. 111–121, "Junction Transistors Used as Switches."

Electronic Design, Feb. 15, 1956, pp. 38–41.

Electrical Manufacturing, January 1957, pp. 54–60, "Static D.C. References for Closed-Logs Controls."